United States Patent [19]

Kakuhashi et al.

[11] 4,204,187
[45] May 20, 1980

[54] PRINTED CIRCUIT SUBSTRATE WITH RESISTANCE ELEMENTS

[75] Inventors: Takeshi Kakuhashi; Yasufumi Miyake, both of Ibaraki, Japan

[73] Assignee: Nitto Electric Industrial Co., Ltd., Ibaraki, Japan

[21] Appl. No.: 884,298

[22] Filed: Mar. 7, 1978

[30] Foreign Application Priority Data

Nov. 14, 1977 [JP] Japan .................................. 52-137155

[51] Int. Cl.$^2$ ............................................. H01C 1/012
[52] U.S. Cl. ...................................... 338/307; 29/829; 156/625; 338/311; 338/314; 427/96
[58] Field of Search ................................. 338/307–309, 338/311, 314, 285; 29/625–627, 610; 96/36.2; 156/625, 664, 666; 427/96, 101, 102

[56] References Cited

U.S. PATENT DOCUMENTS

| | | | |
|---|---|---|---|
| 3,256,588 | 6/1966 | Sikoua et al. | 427/102 X |
| 3,287,191 | 11/1966 | Borth | 156/666 |
| 3,390,992 | 7/1968 | Valles | 96/36.2 |
| 3,864,180 | 2/1975 | Barraclough | 96/36.2 X |
| 3,904,461 | 9/1975 | Estep et al. | 96/36.2 |
| 4,025,404 | 5/1977 | Joly et al. | 338/309 X |
| 4,077,854 | 3/1978 | Estep et al. | 427/96 X |

OTHER PUBLICATIONS

J. G. Ameen, et al., *IBM Technical Disclosure Bulletin*, "Thin Film Resistors on Metallized Substrate," vol. 21, No. 3, pp. 953–954, Aug. 1978.

*Primary Examiner*—C. L. Albritton
*Attorney, Agent, or Firm*—Sughrue, Rothwell, Mion, Zinn and Macpeak

[57] ABSTRACT

In a printed circuit substrate incorporating a resistor pattern film and a conductor pattern film are formed on the two surfaces of a high conductive material layer such as a copper foil, respectively, in a predetermined positional relationship, and an insulating support is combined directly or indirectly with the resistor pattern film on the high conductive material layer, whereby a printed circuit board with resistance elements having high performance can be manufactured, while the number of processing steps can be greatly reduced.

7 Claims, 13 Drawing Figures

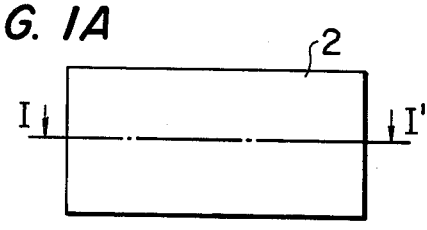
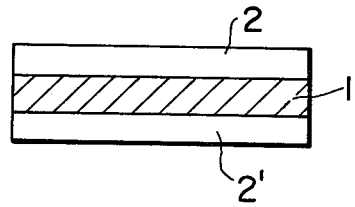
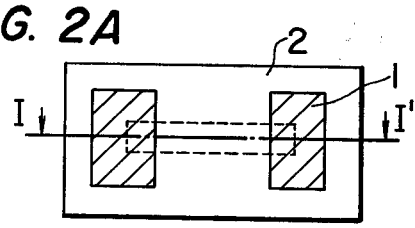
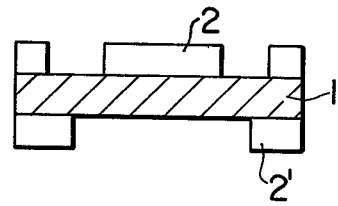
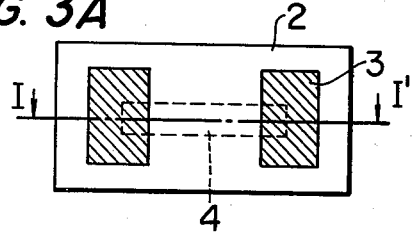
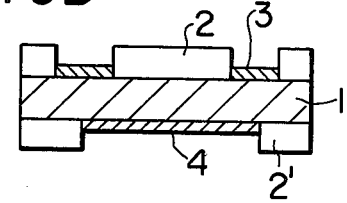
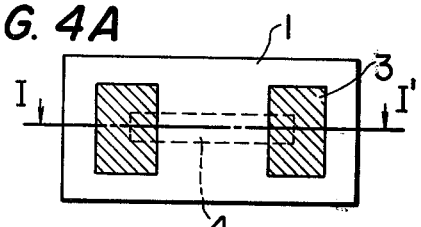
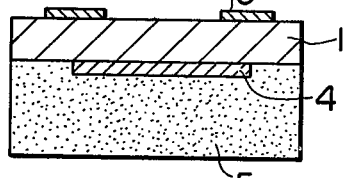
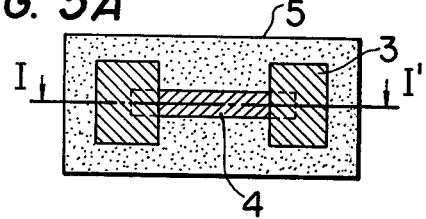
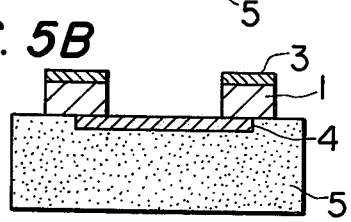
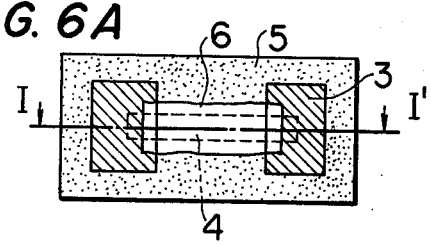
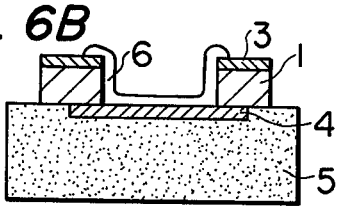
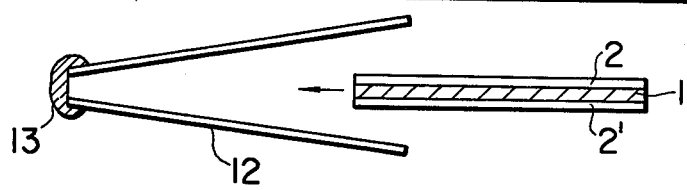

PRINTED CIRCUIT SUBSTRATE WITH RESISTANCE ELEMENTS

BACKGROUND OF THE INVENTION

This invention relates to printed circuit substrates incorporating resistance elements, and more particularly to a novel printed circuit substrate with resistance elements in which a resistor pattern film and a conductor (including electrodes) pattern film are incorporated in advance, whereby a printed resistor circuit board with resistance elements having high performance can be manufactured, while the number of processing steps can be greatly reduced.

A conventional printed circuit substrate incorporating a resistor, which is well known in the art, is a multi-layer stock comprising an insulating support, a resistance layer combined with the entire surface of the insulating support, and a high conductive material layer combined with the resistance layer. In the case where a printed circuit board with resistors is fabricated by using this conventional printed circuit substrate, an insulating region (all the layers on the insulating support being removed), a resistance region (the high conductive material layer being removed), and a conductor region (none of the layers being removed) are formed by a subtractive method (mask-etching method).

A typical one of the prior art concerning printed circuit substrates of this type is that disclosed by Japanese Patent Laid-Open No. 73762/1973. According to this publication, a printed circuit substrate is manufactured and converted into a printed circuit board with resistors through a number of intricate processes as outlined below: One surface of a high conductive material layer such as a copper foil is covered with a removable masking sheet, and a resistance layer is formed on the other surface of the high conductive marterial layer by electrodeposition. Then, the masking sheet is removed, and thereafter an insulating support is combined with the resistance layer. Thus, the printed circuit substrate incorporating a resistor is obtained.

This substrate is further subjected to the following processes: After the surface of the copper foil of the substrate is covered with photoresist, it is subjected to exposure through a photographic negative having a conductor pattern and a resistor pattern in combination (having two patterns corresponding to the conductor region and the resistor region) and is then subjected to development, whereby the photoresist is mantained unremoved in the pattern regions. The copper foil in the region which is not covered with the photoresist is removed by etching, and furthermore the resistance layer exposed is removed by using an etching solution, as a result of which the surface of the insulating support is exposed. Then, the left photoresist is removed by using a removing solution.

Thereafter, the substrate is covered with photoresist again, and is then subjected to exposure through photohgraphic negative having the conductor pattern. The substrate is subjected to development to retain the photoresist in the conductor pattern region. The copper foil in the region which is not covered by the photoresist (or the copper foil having a configuration corresponding to the resistor pattern region) is removed by etching, as a result of which the surface of the resistance layer corresponding to the resistor pattern region is exposed. Then, the remaning photoresist is removed by using a removing solution.

A solder stop-off or the like is applied to the resistance layer in the resistor pattern region by printing, and is then heated and cured to cover the resistance layer. Thus, the printed circuit board with resistors is obtained.

However, the drawback in the above-described process is that, in the second process of cleaning and removing the remaining resist (on the conductor pattern region) by using the removing solution, the resistance layer in the resistance pattern region has been exposed already and is subject to the removing solution. The thickness of the resistance layer is made to the considerably thin, of the order of several hundreds to thousands of Å, in order to increase its sheet resistance. Accordingly, its mechanical strength is very low. Especially, if it is rubbed in a resist removing solution, its combining force with the combining surface of the insulating support is reduced, which leads to damage, the insulating support being, in general, a laminated plate of epoxy resin and glass cloth. Thus, variation of the sheet resistance and lowering of a variety of characteristics are caused.

In order to overcome these various difficulties, a method has been proposed in which the conductor pattern region of the circuit substrate is protected by a gold plating film, and in the final process the copper foil having a configuration corresponding to the resistor pattern region is removed by etching. However, persons skilled in the art will readily understand that in this method the processes are rather intricate, requiring considerable skill.

As is apparent from the above description, the conventional printed circuit substrate incorporating a resistor and its processing technique suffer from various disadvantages that, because the number of processing steps is relatively many and the processes are intricate, it takes a relatively long period of time for the processing, the manufacturing cost is high, the yeild is limited to a certain extent, and the auxiliary material cost is high.

Accordingly, the printed circuit substrate of this type cannot be extensively employed in a variety of industrial fields without solving the above-described problems accompanying the conventional printed circuit substrate.

SUMMARY OF THE INVENTION

Accordingly, it is a primary object of this invention to eliminate all of the above-described difficulties accompanying a conventional printed circuit substrate incorporating a resistor.

More specifically, an object of the invention is to provide a printed circuit substrate incorporating resistance elements in which the number of manufacturing steps is reduced when compared with that in the case of the conventional one.

Another object of the invention is to provide a printed circuit substrate incorporating resistance elements in which an anti-corrosive metallic material can be employed as its resistor pattern film thereby improving the stability and performance thereof.

A further object of the invention is to provide a printed circuit substrate incorporating resistance elements in which two or more resistor pattern films different in sheet resistance are incorporated therein and the resistance range of its resistance elements can be increased.

A still further object of the invention is to provide a printed circuit substrate incorporating resistance elements in which the manufacturing cost is reduced and the amount of material is also reduced when compared with those in the case of the conventional one.

The foregoing objects and other objects of the invention have been achieved by the provision of a printed circuit substrate with resistance elements which, according to this invention, comprises a high conductive material layer, and an insulating support, the high conductive material layer having a resistor pattern film and a conductor pattern film respectively on both surfaces thereof in predetermined positional relation to each other, the high conductive material layer being combined with at least one surface of the insulating support through the resistor pattern film.

In this invention, it is necessary that the resistor pattern film and the conductor pattern film provided respectively on the two surfaces of the high conductive material layer are arranged in a predetermined positional relation to each other. The term "predetermined positional relation" is intended to mean a positional relation in which a predetermined printed circuit board with resistance elements can be obtained by processing the printed circuit substrate.

In the invention, an anti-corrosive material which is not affected by an etching solution for etching the high conductive material layer is employed as the conductor pattern film, so that the printed circuit board with resistance elements can be obtained by etching the high conductive material layer only once (if necessary, the resistor pattern film being covered with a solder stop off), which leads to a reduction of the number of processing steps. Furthermore, as the material of the resistor pattern film, an anti-corrosive metallic material is preferably employed which is not affected by one application of the etching solution for etching the high conductive material layer. In this case, in view of the strength and accuracy of the resistance element, it is preferable to form the resistor pattern film with an anti-corrosive metallic material by plating which is not affected by the etching solution and which is equal to or different from the material of the conductor pattern film, to the thickness of the order of 100 Å to 2000 Å. The resistor pattern film may be also formed by printing according to the ordinary method.

The nature, principle and utility of the invention will become more apparent from the following detailed description and the appended claims when read in conjunction with the accompanying drawings, in which like parts are designated by like reference numerals.

BRIEF DESCRIPTION OF THE DRAWINGS

In the accompanying drawings:

FIGS. 1 through 4 are diagrams of a description of steps of manufacturing a printed circuit substrate with resistance elements according to this invention. More specifically, the parts A of FIGS. 1 through 4 are plan views showing the printed circuit substrate being manufactured, while the parts B of FIGS. 1 through 4 are sectional views taken along lines I—I' in the parts A of FIGS. 1 and 4, respectively.

FIG. 5 and FIG. 6 are diagrams for a description of steps of converting the printed circuit substrate into a printed circuit board. More specifically, the parts A of FIGS. 5 and 6 are plan views showing the printed circuit substrate being processed, while the parts B of FIGS. 5 and 6 are sectional views taken along lines I—I' in the parts A of FIGS. 5 and 6, respectively; and FIG. 7 is an explanatory diagram illustrating an operation for providing in a predetermined positional relationship a resistor pattern film and a conductor pattern film on a high conductive material layer in the printed circuit substrate according to the invention.

DETAILED DESCRIPTION OF THE INVENTION

One preferred example of a printed circuit substrate according to this invention will be described in detail with reference to the accompanying drawings.

A photoresist is applied to both surfaces of a high conductive material layer 1 such as a copper foil with a dip coater or a roll coater, and is then subjected to drying, thereby forming photoresist layers 2 and 2' on the two surfaces of the copper foil as shown in the parts A and B of FIG. 1.

Then, one side of a photographic negative 11 for forming a conductor (including electrodes) pattern is connected, in the form of a hinge, to one side of a photographic negative 12 for forming a resistor pattern by means of a clip 13 or the like, as shown in FIG. 7. Thereafter, the copper foil coated with the photo-resist is placed between the two photographic negatives 11 and 12 and is subjected to exposure by the use of a double surface exposor. The copper foil with the photoresist layers thus treated is developed whereby the surfaces of the copper corresponding to the conductor pattern and resistor pattern regions are exposed as shown in FIG. 2.

The two pattern regions on the copper foil are plated, so that a conductor pattern film 3 and a resistor pattern film 4 are formed on two surfaces of the copper foil 1, respectively, as shown in FIG. 3. With respect to the composition of the plated film, if a metallic material stable with an etching solution for copper corrosion carried out later is employed, the plated film in the conductor pattern serves as etch-resist during etching the copper. However, in the case where a metallic material which is not so stable with the etching solution for copper corrosion is employed, after plating as resistor pattern film (resistance elements) and conductor pattern film has been carried out in the two pattern regions, the conductor pattern film can be additionally plated with an anti-corrosive metal while resistor pattern film being masked.

Then, after the photoresist layers and the masking agent left after the plating process have been removed, the unit is subjected to washing and drying. Thereafter a glass cloth impregnated with epoxy resin (so-called prepreg), for instance, is placed on the side of the unit where the resistor pattern is provided, and is then heated and pressurized, thereby forming an insulating support 5 as shown in FIG. 4. Thus, a printed circuit substrate with resistance elements in which the resistor pattern film is incorporated and the conductor pattern region is formed by the anti-corrosive conductor pattern film, has been fabricated.

With the printed circuit substrate according to this invention, a printed circuit board can be manufactured by a simple process including a copper etching operation. More specifically, the printed circuit substrate shown in FIG. 4 is immersed into an etching solution for copper corrosion, as a result of which the exposed portions of the copper foil 1 are subjected to etching and therefore the insulating support 5 is exposed. In this case, the conductor pattern film 3 and the resistor pattern film 4 are not corroded by the etching solution. After completion of the etching process, the unit is subjected to washing and drying, as a result of which the printed circuit board shown in FIG. 5 can be obtained. If necessary, a cover coat layer 6 may be applied on the surface of the unit for the protection of the resistor pattern film 4 as shown in FIG. 6.

The above description is to outline the invention. The materials of components suitable for embodying the fundamental concept of the invention, and the structural improvement and modification included in the invention will now be described more concretely.

A copper foil is most extensively employed as the high conductive material (layer) used in this invention; however, an aluminum foil, a tin-plated copper foil, an zinc foil, and a silver foil can be employed also.

With respect to the conductor pattern film formed on the high conductive material layer, it is preferably formed with a metallic material having a sufficiently high corrosion resistance against an etching solution by electroplating or chemical plating, because as is apparent from the structure of the unit according to the invention the period of time during which the conductor pattern film is in contact with the etching solution is longer than the period of time during which the resistor pattern film is in contact with the etching solution. The resistor pattern film can be formed by utilizing a metallic material, and may be a plated film of metallic material which is equal to or different from the conductor pattern film in material quality. Therefore, noble metals such as gold, slver, platinum and rhodium or alloys of them, anti-corrosive metals such as tantalum, tungsten, titanium, molybdenum and chromium or alloys of them, and tin-cobalt, tin-zinc, tin-cadmium, nickel-phosphorus alloys which are improved in corrosion resistance by alloying, can be employed as the materials of the two films. Furthermore, it is preferable to determine the metallic material by taking into consideration not only the corrosion resistance but also its electrical characteristics such as resistance, temperature coefficient, and resistance stability; its mechanical characteristics such as soldering characteristics and sliding characteristic as a conductor or electrode; and the characteristics of a plating bath such as throwing power, and stability of a bath which may greatly affect the yield in a plating process. In view of the foregoing, the plating of tin-nickel alloy is one of the kinds of plating which is preferred on the basis of stability in alloy composition and cost.

On the other hand, in the case where the plated film of a metallic material is limited to a material or a thin film which is excellent in characteristic as the resistor pattern film but is inferior in corrosion resistance as the conductor pattern film plating may be carried out additionally to cover the conductor pattern film with a metallic material which is different in quality from the resistor pattern film and is high in corrosion resistance, or a conductor pattern film may be formed with the different metallic material which is the same as the above-mentioned additionally covered material.

Furthermore, in the present invention, it is possible that a resistor paste obtained by mixing a fine powder of carbon such as lamp black, graphite or the like with a binder such as methacrylic resin, epoxy resin or the like is printed on a high conductive material layer by screen printing and is then cured at a temperature of the order of 140° to 180° C. to obtain resistor pattern film in a desired shape.

Employed as the insulating support are laminated plates made of epoxy resin - glass cloth, polyester - glass cloth, polyimide - glass cloth, polyamidomide - glass cloth, phenol resin - paper, and epoxy resin - paper; polyimide; polyester; polyamidoimide; and a flexible insulating sheet or film made of flexible epoxy resin - glass cloth or flexible polyamide - paper. Furthermore, a variety of above-described insulating laminated plates, sheets or films with an aluminum plate or iron plate connected (to the surface of the unit opposite to the surface where the resistor pattern film is formed) can be employed.

Inorganic materials such as ceramic plates, and glass plates in which resins and rubbers such as epoxy resin, polyester, polyurethane, polyamideimide, polyimide and rubber are employed as adhesive layers, can also be employed as the insulating support.

For simplification in description, the structure of the printed circuit substrate in which the high conductive material layer on which the resistor pattern film and the conductor pattern film are formed in the predetermined positional relation to each other is combined with only one surface of the insulating support has been described. However, it should be noted that the printed circuit substrate includes a structure in which the high conductive material layers having the resistor pattern films and the conductor pattern films are provided on the two opposite surfaces of the insulating support, respectively, and a structure in which the high conductive material layer having the resistor pattern film and the conductor pattern film is provided on one of the two opposite surfaces of the insulating support while the high conductive material layer without such pattern films (for forming conductors or electrodes by etching) is provided on the other surface of the insulating support.

In the former structure where two high conductive material layers with the pattern films are provided on both sides of the insulating support, it is advisable that, when the insulating support is combined, guide holes are formed in the corners of the two high conductive material layers in advance so that the insulating support is combined with the high conductive material layers by fixing them in place with guide pins.

Well known etching solutions can be employed as the etching solution for the high conductive material layer. For instance, in the case of copper foils, one selected out of the group consisting of ferric chloride, ammonium persulfate, cupric chloride, a chromic acid sulfuric acid mixture solution, and a variety of ammoniachelate-type etching solution is employed by taking into consideration the corrosion resistance of the material of the resistor pattern film.

As is apparent from the above description, the printed circuit substrate with the resistor according to the invention has a considerably useful merit that it can be conversed into a printed circuit board with high accuracy by a simple process. The importance features of the present invention are as follows:

(1) In the case of the conventional printed circuit substrate whose structure is such that a resistance layer is provided on the entire surface of a high conductive material layer such as a copper foil and an insulating support is combined with the side of the resistance layer, the high conductive material layer is subjected to two etching processes, and the resistance layer is subjected to one etching process. Accordingly, the resistance region of the resultant printed circuit board is subjected to the etching process three times; that is, it is excessively etched, which leads to a decrease in etching accuracy. Furthermore, the conventional printed circuit substrate necessitates a photo-masking process following the etching process, the photo-masking process including photoresist coating, exposing and developing processes, as a result of which the auxiliary material cost and the manufacturing cost are necessarily increased, and the yield in manufacturing of the desired printed circuit board is lowered.

On the other hand, according to the invention, the conductor pattern film is formed on one surface of the high conductive material layer forming the circuit substrate, while the resistor pattern film is formed on the other surface. Therefore, by employing a material which is anti-corrosive against the etching solution applied to the high conductive material layer, as the conductor pattern film, the desired printed circuit board with resistance elements can be formed by carrying out the etching process for the high conductive material layer only once. Accordingly, it is possible to reduce the number of etching processes to one-third of that in the case of conventional printed circuit substrate. This is one of the significant merits of the invention. Since it is not necessary to subject the resistor pattern film to etching, it goes without saying that the resistor pattern film does not suffer from excessive etching.

Furthermore, the photo-masking process is carried out only in manufacturing the circuit substrate, and is not needed in treatment process. Therefore, the manufacuturer can save the equipment cost, auxiliary material cost and matching cost which is necessary for the photo-masking process, and the yield of manufacturing the printed circuit board can be improved.

(2) In the conventional printed circuit substrate, the resistance layer is formed on the entire surface of the high conductive material layer, and therefore it is necessary to etch the resistance layer in order to form the required pattern. Accordingly, the material of the resitance layer is limited to, for instance, the alloy of nickel and phosphorus which can be etched, no matter how excellent other materials are in characteristic. That is, a number of noble metals which cannot be etched or anti-corrosive alloys cannot be employed as the resistance layer.

On the other hand, in the present invention, the resistor pattern film is not subjected to etching. Accordingly, anti-corrosive metallic materials can be employed, which contributes to improvement of stability and performance of the resistance elements.

(3) In general, an actual printed circuit board with resistors needs a variety of resistors different in resistance. However, in the prior art, the resistance layer is formed on the entire surface of the high conductive material layer, and therefore only one kind of resistance layer is necessarily employed. Accordingly, the sheet resistance value is also limited to one kind. Thus, the conventional printed circuit board is limited in resistance value.

On the other hand, according to the invention, the above-described drawback accompanying the conventional printed circuit board can be completely eliminated. In other words, if the photo-masking process and the formation of the resistor pattern film for the high conductive material layer are repeated twice or more, more than two kinds of resistor pattern film different in sheet resistance can be incorporated in the printed circuit substrate, whereby the resistance range of the resistance elements can be increased.

(4) In the prior art, formation of the resistance pattern from the resistance layer is carried out by etching a thick high-conductive material layer (for instance 35μ in the case of a copper foil which is most extensively employed) through a photo-mask. Therefore, it is impossible to manufacture resistance elements in the form of a fine, delicate pattern.

On the other hand, in the circuit substrate according to the invention the resistor pattern film is formed directly on the high conductive material layer by plating or the like. Therefore, it is possible to build in the circuit substrate resistance elements in the form of a fine, delicate pattern. In addition, even if the same material as that in the prior art is used, it is possible to manufacture resistance elemetns higher in resistance.

(5) In the prior art, the resistance layer is formed over the entire surface of the high conductive material layer by plating. On the other hand, in the invention, plating the resistor pattern film is effected in the form of a pattern. Therefore, consumption of the plating bath is greatly reduced, and the plating bath can be maintained stable for a long period of time, which leads to reducing cost and to saving material.

Now, this invention will be described concretely with reference to examples thereof.

EXAMPLE 1

A copper foil having a particular size is cut, and it is immersed in a cleaning solution (obtained by diluting one volume of condensate of Shiply Company Inc. Neutra-Clean 68 with one volume of water, at 40° C.) for three minutes. Thereafter, the copper foil thus treated is rinsed. Then, it is immersed in 10% sulfuric acid for three minutes. Thereafter, it is rinsed and dried.

The copper foil thus treated is immersed in a liquid-state photoresist (which is a photoresist AZ-111 made by the Shiply Company Inc.), and is then dried by the ordingary method to cover the two surfaces of the copper foil with the photoresist. Then, the copper foil with the photoresist is placed between the photographic negative for resistor pattern and the photographic negative for cunductor (including electrodes) pattern which have been provided in advance as shown in FIG. 7, and is subjected to exposure by means of a double surface exposer according to the ordinary method. Then, it is developed with a specific developing solution, thereby exposing the surfaces of the copper foil in correspondence to the resistor pattern and the conductor pattern. Thereafter, it is rinsed, and is then immersed in the above-described cleaning solution (Neutra-Clean 68) for three minutes. Furthermore, it is rinsed and is then immersed in 20% hydrochloric acid for three minutes. Thereafter, it is rinsed and is then cleaned with a deionized water.

Then, the copper foil is subjected to tin-nickel plating to form tin-nickel films on the copper-exposed surfaces of the copper foil, hat is, to form a resistor pattern film and a conductor pattern film.

| Composition of Plating Bath | |
|---|---|
| $SnCl_2\ 2H_2O$ | 28 g/l |
| $NiCl_2\ 6H_2O$ | 30 g/l |
| $K_4P_2O_7\ 3H_2O$ | 200 g/l |
| Nitroethane | 20 g/l |
| Diammonium citrate | 10 g/l |
| Electrolytic Conditions | |

-continued

| Composition of Plating Bath | |
|---|---|
| Temperature | 50° C. |
| PH | 8.2 (25° C.) |
| Current density | 0.1 A/dm$^2$ |
| Agitation | None |
| Anode | Nickel Plate |

A resistance film of a sheet resistance 300 Ω/□ can be obtained by subjecting the copper foil to plating for 70 seconds. After the electrodeposition, the copper foil is taken out, and the photoresist left on the copper foil is removed by the ordinary method. Then, it is rinsed with hot water, and thereafter it is rinsed with a deionized water is dried.

Then, an epoxy resin containing glass cloth (so-called prepreg) is placed over the surface of the copper foil where the resistor pattern film have been formed, and is then heated and pressurized by means of a lamination press so that the glass cloth is combined with the copper foil in the form of a laminated plate. Thus, the printed circuit substrate with the resistance elements according to the invention has been obtained.

A printed circuit board with resistance elements is fabricated from the printed circuit substrate as follows:

The copper of the substrate is subjected to etching by using Neutra-Etch V-1 (made by Shiply Company Inc.). The temperature of the etching solution is 52° C., and the PH thereof is 7.5 (at 25° C.).

The conductor (including electrodes) section is protected by the aforementioned tin-nickel film. The copper is etched, as a result of which the tin-nickel pattern film serving as the resistance elements is exposed.

After cleaning it is dried. Then, a solder stock-off is applied to the resistance region by printing, and is then heated. Thus, the printed circuit board with resistance elements has been fabricated.

The characteristics of the resistance element is as indicated below:

Sheet resistance value: 300 Ω/□ (variation within 5%)
Resistance-temperature coefficient: +70 ppm/°C. or less (Temperature range −65° to +125° C.)
Moisture-proof characteristic: +0.7 or less
(Resistance variation percentage in 240 hours with a temberature of 40° C., a relative humidity 95%, and no-load)
Heat-resisting characteristic in soldering: +0.7% or less
(Resistance variation percentage after it is immersed in a soldering bath at a temperature of 260° C. for 20 seconds)

EXAMPLE 2

A printed circuit substrate including resistor pattern films different in sheet resistance is manufactured and the circuit board with resistance elements is treated as follows:

Similarly as in the case of Example 1, a copper foil subjected to plating is taken out of a plating bath, and is then rinsed. Thereafter, the photoresist is removed therefrom by the ordinary method, and is then subjected to rinsing and drying. Then, similarly as in the above-described method, photoresist is applied to the unit and is dried again.

Then the unit is subjected to exposure through the second photographic negative for resistor pattern which has been prepared in advance, and is developed with a specific developing solution to expose the surfaces of the copper foil in the form of a resistor pattern and at desired positions. The unit thus treated is rinsed and is then cleaned with a deionized water. Thereafter, the second plating is carried out with the plating bath described in Example 1.

A resistance film having a sheet resistance of 100 Ω/ is obtained under the conditions that the current density is 0.1 A/cm$^2$ and the plating period of time is 180 seconds.

After plating, the unit is sufficiently rinsed, and the photoresist left is removed. Thereafter, the unit is rinsed with hot water, and is then cleaned with a deionized water. Furthermore, it is dried. Then, similarly as in the case of Example 1, the insulating support is combined with the unit thus treated. As a result, the circuit substrate with resistance elements in which two resistor pattern films, 100 Ω/□ and 300 Ω/□ in sheet resistance, have been formed is obtained. Furthermore, similarly as in the above-described case, the copper is etched, and cover-coating for the resistance regions is carried out to accomplish the formation of the circuit board with resistance elements.

The characteristics of the resistance element having a sheet resistance of 300 Ω/□ are the same as those described above. The characteristics of the resistance element obtained by applying the second plating are as follows:

Sheet resistance value: 100 Ω/□ (variation ±5% or less)
Resistance-temperature coefficient: +60 ppm/°C. or less (Temperature range −65° to +125° C.)
Moisture-proof characteristic: +0.4% or less
(Resistance variation percentage in 240 hours with a temperature of 40° C., a relative humidity 95%, and no-load).
Heat-resisting characteristic in soldering: +0.3% or less
(Resistance variation percentage after it is immersed in a soldering bath at a temperature of 260° C. for 20 seconds)

EXAMPLE 3

A printed circuit substrate having resistance elements, whose conductor (including electrodes) section surface is plated with gold, is manufactured as follows:

Tin-nickel patterns are formed on both surfaces of a copper foil by tin-nickel plating. The unit thus formed is subjected to rinsing and drying. Thereafter, without removal of the left photoresist, a masking adhesive sheet (SPV No. 224 made by the Nitto Denki Kogyo K.K.) is fixedly placed over the surface of the unit where the resistor pattern film has been formed. Then, the unit thus treated is immersed in a cleaning solution (which is the aforementioned Neutra-clean 68) for three minutes. After being rinsed, the unit is immersed in surface smoothening solution (Japan Metal Finishing Company Limited Enplalate AD-485) for 30 seconds, and is then rinsed. Furthermore, it is immersed in 10% sulfuric acid for 30 seconds, and is then rinsed. Thereafter, it is rinsed with a deionized water, and is then subjected to gold plating under the following conditions:

Plating bath: Temperex 401
(made by the Nippon Electroplating Engineers K.K.)
Electrolytic conditions
Temperature: 57° C.
PH: 6.0 (25° C.)

Current density: 0.5 A/dm$^2$
Agitation: effected
Anode: insoluble

After completion of the gold plating, the unit is rinsed thoroughly, and the masking sheet and the left photoresist are removed in the ordinary method. Then, the unit is rinsed thoroughly again and is then dried. Thereafter, an insulating support is combined with the surface of the unit where the resistor pattern film has been formed. Thus, a printed circuit substrate with resistance elements in which the conductor pattern film is plated with gold is obtained. This printed circuit substrate can be converted into a circuit board with resistance elements in accordance with the same process as that in Example 1.

EXAMPLE 4

Similarly as in the case of Example 1, a copper foil (covered with photoresist except for the resistor and conductor pattern sections) the surface of which is exposed in the form of a resistor pattern and in the form of a conductor (including electrodes) pattern is cleaned with a cleaning solution (Neutra-clean 68 made by Shiply Company Inc.) and 20% hydrochloric acid. Thereafter, the unit is subjected to rinsing, and is then cleaned with a deionized water. Then, the copper exposed portions of the unit are subjected to plating under the following conditions:

| Composition of Plating Bath | |
|---|---|
| KAu (CN)$_2$ | 17.5 g/l |
| Potassium citrate (K$_3$C$_6$H$_5$O$_7$ H$_2$O) | 70 g/l |
| Citric acid | 18 g/l |
| Electrolytic conditions | |
| Temperature: 55° C. | |
| PH: 6.0 (25° C.) | |
| Current density: 0.03 A/dm$^2$ | |
| Agitation: Effected | |
| Anode: Platinum plated titanium net | |
| Plating period: 150 seconds | |

After completion of the plating process, similarly as in the case of Example 1 a printed circuit substrate with resistance elements is obtained. Furthermore, the printed circuit substrate is converted into a circuit board with resistance elements in the same manner as that described above.

In this example also, the gold plating film serves not only as the resistor pattern film but also as a etch-resist for protecting the conductor (including electrodes) section.

Thus, it is apparent that the gold plating film which has been unemployable as the resistance film in the conventional method because of difficulty in etching it becomes employable according to the invention. The characteristics of the obtained circuit board are as listed below:

(Characteristics)

Sheet resistance: 200 Ω/□ (variation ±5% or less)
Resistance-temperature coefficient: +70 ppm/°C. or less (Temperature range −65° to +125° C.)
Moisture-proof characteristic: +0.5% ot less (Resistance variation percentage in 240 hours with a temperature of 40° C., a relative humidity 95%, and no-load)

Heat-resisting characteristic in soldering: +0.7% or less (Resistance variation percentage after it is immersed in a soldering bath at a temperature of 260° C. for 20 seconds)

What is claimed is:

1. A printed substrate incorporating resistive elements comprising in combination:
   (a) an insulating support;
   (b) a layer of resistive material of predetermined dimensions embedded in said insulating support and having an outer surface flush with an outer surface of said insulating support;
   (c) first and second regions of highly conductive material positioned in contact with spaced-apart portions of said layer of resistive material, said first and second regions of highly conductive material being positioned upon at least portions of said outer surface of said resistive layer; and
   (d) first and second conductor pattern film layers formed on said first and second regions of highly conductive material respectively at a position opposite said layer of resistive material.

2. A printed circuit substrate with resistance elements as claimed in claim 1, wherein said first and second regions of highly conductive material are positioned both upon portions of said outer surface of said resistive layer and portions of said outer surface of said insulating support.

3. A printed circuit substrate with resistance elements as claimed in claim 1, in which said conductor pattern film layers are made of a metallic material which is anti-corrosive against an etching solution for etching the material of said regions of highly conductive material.

4. A printed circuit substrate with resistance elements as claimed in claim 1, in which said layer of resistive material and conductor pattern film layers are made of the same anti-corrosive metallic material which is anti-corrosive against an etching solution for etching the material of said regions of highly conductive material.

5. A printed circuit substrate with resistance elements as claimed in claim 1, in which said layer of resistive material and conductor pattern film layers are made of different anti-corrosive metallic materials each of which is anti-corrosive against an etching solution for etching the material of said regions of highly conductive material.

6. A printed circuit substrate with resistance elements as claimed in claim 1, in which said layer of resistive material and conductor pattern film layers are formed by plating.

7. A printed circuit substrate with resistance elements as claimed in claim 1, in which said layer of resistive material is formed by printing a resistance material, while said conductor pattern film layers are formed by plating with a metallic material which is anti-corrosive against an etching solution for etching the material of said regions of highly conductive material.

* * * * *